US011227744B2

(12) United States Patent
Matsumoto

(10) Patent No.: US 11,227,744 B2
(45) Date of Patent: Jan. 18, 2022

(54) MULTI-BEAM WRITING METHOD AND MULTI-BEAM WRITING APPARATUS

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 12 days.

(21) Appl. No.: 16/924,828

(22) Filed: Jul. 9, 2020

(65) Prior Publication Data

US 2021/0013003 A1 Jan. 14, 2021

(30) Foreign Application Priority Data

Jul. 11, 2019 (JP) .............................. JP2019-129422

(51) Int. Cl.
*H01J 37/31* (2006.01)
*H01J 37/20* (2006.01)
*G03F 7/00* (2006.01)
*H01J 37/317* (2006.01)
*G03F 7/20* (2006.01)

(52) U.S. Cl.
CPC ...... *H01J 37/3177* (2013.01); *G03F 7/70191* (2013.01); *H01J 37/20* (2013.01); *H01J 2237/20228* (2013.01); *H01J 2237/30416* (2013.01)

(58) Field of Classification Search
CPC .................. H01J 37/3177; H01J 37/20; H01J 2237/20228; H01J 2237/30416; G03F 7/70191

USPC ... 250/492.1, 492.2, 492.21, 492.22, 492.23, 250/492.3
See application file for complete search history.

(56) References Cited

U.S. PATENT DOCUMENTS 6,707,839 B1 * 3/2004 Sakata .................. H01S 5/4031
372/96
2016/0015561 A1 1/2016 Kawana et al.
(Continued)

FOREIGN PATENT DOCUMENTS

EP 3 355 337 A1 8/2018
JP 10-261557 A 9/1998
(Continued)

*Primary Examiner* — Nicole M Ippolito
(74) *Attorney, Agent, or Firm* — Oblon, McClelland, Maier & Neustadt, L.L.P.

(57) ABSTRACT

In one embodiment, a multi-beam writing method includes forming a beam array of a multi-beam, assigning sub-beam arrays to each of a plurality of sub-stripe regions, the sub-stripe regions being obtained by dividing a region on the substrate, and the sub-beam arrays being obtained by dividing the beam array, calculating an irradiation time modulation rate being used for each beam belonging to each of the sub-beam arrays, calculating a weight for each of the sub-beam arrays based on the irradiation time modulation rate for each of the beams belonging to a group of the sub-beam arrays, and assigning the calculated weight to the sub-beam array, and performing multiple writing on each of the sub-stripe regions by performing writing on each of the sub-stripe regions with the sub-beam arrays, based on the weight assigned to the sub-beam array and the irradiation time modulation rate of the beam belonging to the sub-beam array.

12 Claims, 14 Drawing Sheets

(56) References Cited

U.S. PATENT DOCUMENTS

| | | |
|---|---|---|
| 2016/0071692 A1 | 3/2016 | Ogasawara |
| 2018/0218879 A1 | 8/2018 | Platzgummer et al. |
| 2021/0240074 A1* | 8/2021 | Spengler ............... H01J 37/304 |

FOREIGN PATENT DOCUMENTS

| | | |
|---|---|---|
| JP | 2016-058714 A | 4/2016 |
| JP | 2016-103557 A | 6/2016 |
| JP | 2018-121060 A | 8/2018 |

* cited by examiner

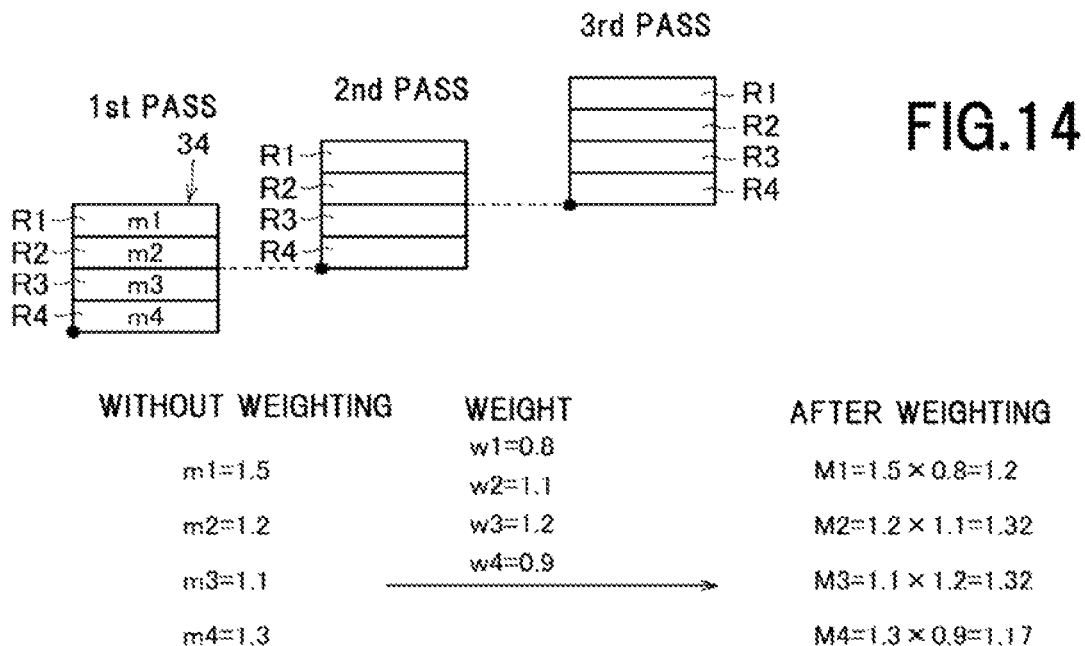
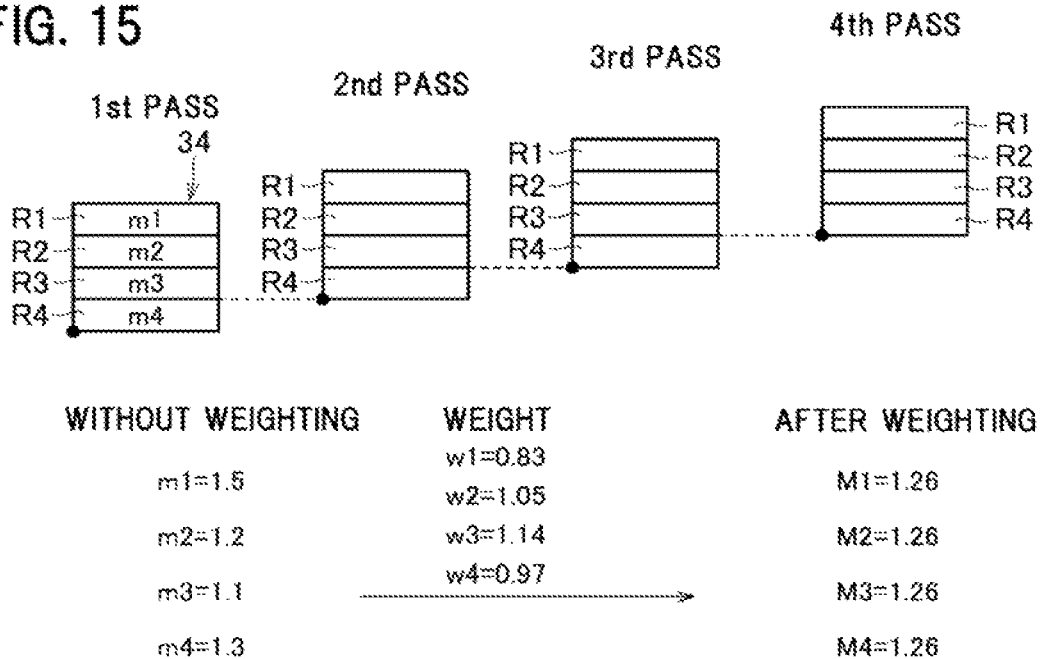

| WITHOUT WEIGHTING | WEIGHT | | AFTER WEIGHTING |
|---|---|---|---|
| m1=1.5 | w1=0.83 | w5=1.05 | M1=1.26 |
| | w2=1.05 | w6=1.05 | |
| m2=1.2 | w3=1.05 | w7=1.05 | M2=1.26 |
| m3=1.2 | w4=1.05 | w8=0.83 | M3=1.26 |
| m4=1.2 | → | | M4=1.26 |
| m5=1.2 | | | M5=1.26 |
| m6=1.2 | | | M6=1.26 |
| m7=1.2 | | | M7=1.26 |
| m8=1.5 | | | M8=1.26 |

| WITHOUT WEIGHTING | WEIGHT | | AFTER WEIGHTING |
|---|---|---|---|
| m1=1.5 | w1=0.82 | w5=1.03 | M1=1.23 |
| m2=1.2 | w2=1.03 | w6=1.23 | M2=1.23 |
| m3=1.2 | w3=1.03 | w7=1.27 | M3=1.23 |
| m4=1.5 | w4=1.82 | w8=0.82 | M4=1.23 |
| m5=1.2 | | | M5=1.23 |
| m6=1.0 | | | M6=1.23 |
| m7=1.0 | | | M7=1.23 |
| m8=1.5 | | | M8=1.23 |

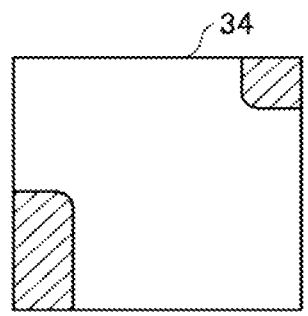
FIG. 20A
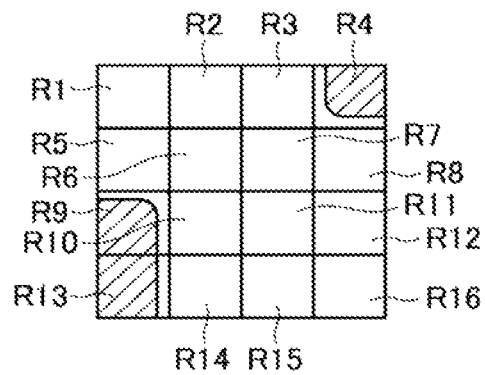
FIG. 20B
FIG. 21A
MULTIPLICITY:8
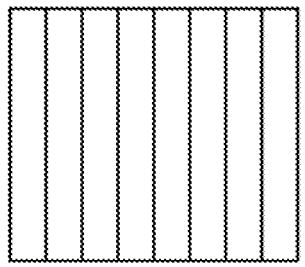
FIG. 21B
MULTIPLICITY:8
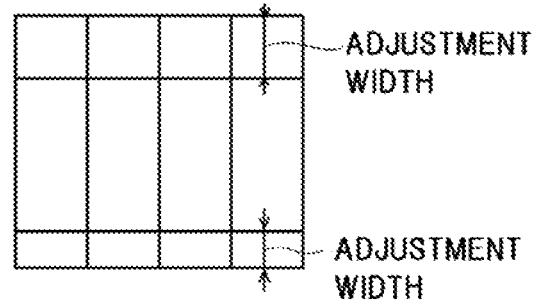
FIG. 21C
MULTIPLICITY:16
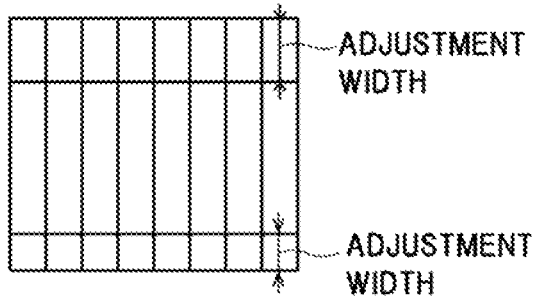
FIG. 21D
MULTIPLICITY:16
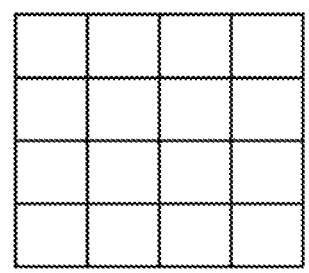

MULTI-BEAM WRITING METHOD AND MULTI-BEAM WRITING APPARATUS

CROSS REFERENCE TO RELATED APPLICATION

This application is based upon and claims benefit of priority from the Japanese Patent Application No. 2019-129422, filed on Jul. 11, 2019, the entire contents of which are incorporated herein by reference.

FIELD

The present invention relates to a multi-beam writing method and a multi-beam writing apparatus.

BACKGROUND

Along with high integration of LSI, a circuit line width required for a semiconductor device is decreasing year by year. In order to form a desired circuit pattern in a semiconductor device, a technique is used, which reduction-transfers a highly accurate original pattern onto a wafer using a reducing projection exposure apparatus, the highly accurate original pattern being formed on a quartz substrate as a light shielding film or a reflection film. For production of such a highly accurate original pattern, so-called an electronic beam lithography technology is known, which exposes a resist with light to form a pattern by an electron beam writing apparatus.

A writing apparatus that uses a multi-beam can irradiate with many beams at one time, as compared with when writing is performed with a single electron beam, thus the throughput can be significantly improved. In a multi-beam writing apparatus using a blanking aperture array, as an embodiment of the multi-beam writing apparatus, for instance, an electron beam discharged from an electron gun passes through a shaping aperture array having multiple openings, and forms a multi-beam (multiple electron beams). The multi-beam passes through the corresponding later-described blankers of the blanking aperture array. The blanking aperture array has electrode pairs for individually deflecting the beams, and an opening for beam passage is formed between each electrode pair. Blanking control on a passing electron beam is performed by controlling the electrode pair (blanker) at the same potential or at different potentials. An electron beam deflected by the blanker is shielded, and an electron beam not deflected by the blanker is emitted to a substrate.

In the multi-beam writing, an irradiation position shift of a beam due to lens distortion and a variation in the intensity of each beam may occur, and it is not possible to correct these defects for each beam. However, it is possible to eliminate the effect of beam position displacement on a dose distribution applied to the resist by modulating the irradiation amount for each beam.

However, a problem arises in that due to modulation of the irradiation amount, the maximum irradiation amount per beam is increased and the irradiation time is increased, thus the writing throughput is degraded.

BRIEF DESCRIPTION OF THE DRAWINGS

FIG. 14 is a chart showing an example of a writing method of multiple writing and weighting of modulation rates.

FIG. 15 is a chart showing an example of a writing method of multiple writing and weighting of modulation rates.

FIGS. 20A and 20B are views showing an example of divided regions.

FIGS. 21A to 21D are views showing an example of divided regions.

DETAILED DESCRIPTION

In one embodiment, a multi-beam writing method includes forming a beam array of a multi-beam for scanning a region on a substrate and performing multiple writing, assigning sub-beam arrays to be used for writing to each of a plurality of sub-stripe regions for each time of the writing in the multiple writing, the sub-stripe regions being obtained by dividing a region on the substrate into regions smaller than or equal to a width of the beam array, and the sub-beam arrays being obtained by dividing the beam array, calculating an irradiation time modulation rate being used for each beam belonging to each of the sub-beam arrays, calculating a weight for each of the sub-beam arrays based on the irradiation time modulation rate for each of the beams belonging to a group of the sub-beam arrays, and assigning the calculated weight to the sub-beam array, the group of the sub-beam arrays corresponding to a group of the sub-stripe regions overlapped each other on the substrate, and performing multiple writing on each of the sub-stripe regions by performing writing on each of the sub-stripe regions with the sub-beam arrays, based on the weight assigned to the sub-beam array and the irradiation time modulation rate of the beam belonging to the sub-beam array.

An embodiment of the present invention will be described below with reference to the drawings. In the embodiment, a configuration using an electron beam as an example of a charged particle beam will be described. The beam is not limited to the electron beam. For example, a beam using other charged particles such as an ion beam or a beam using laser may be used.

Figure 1:
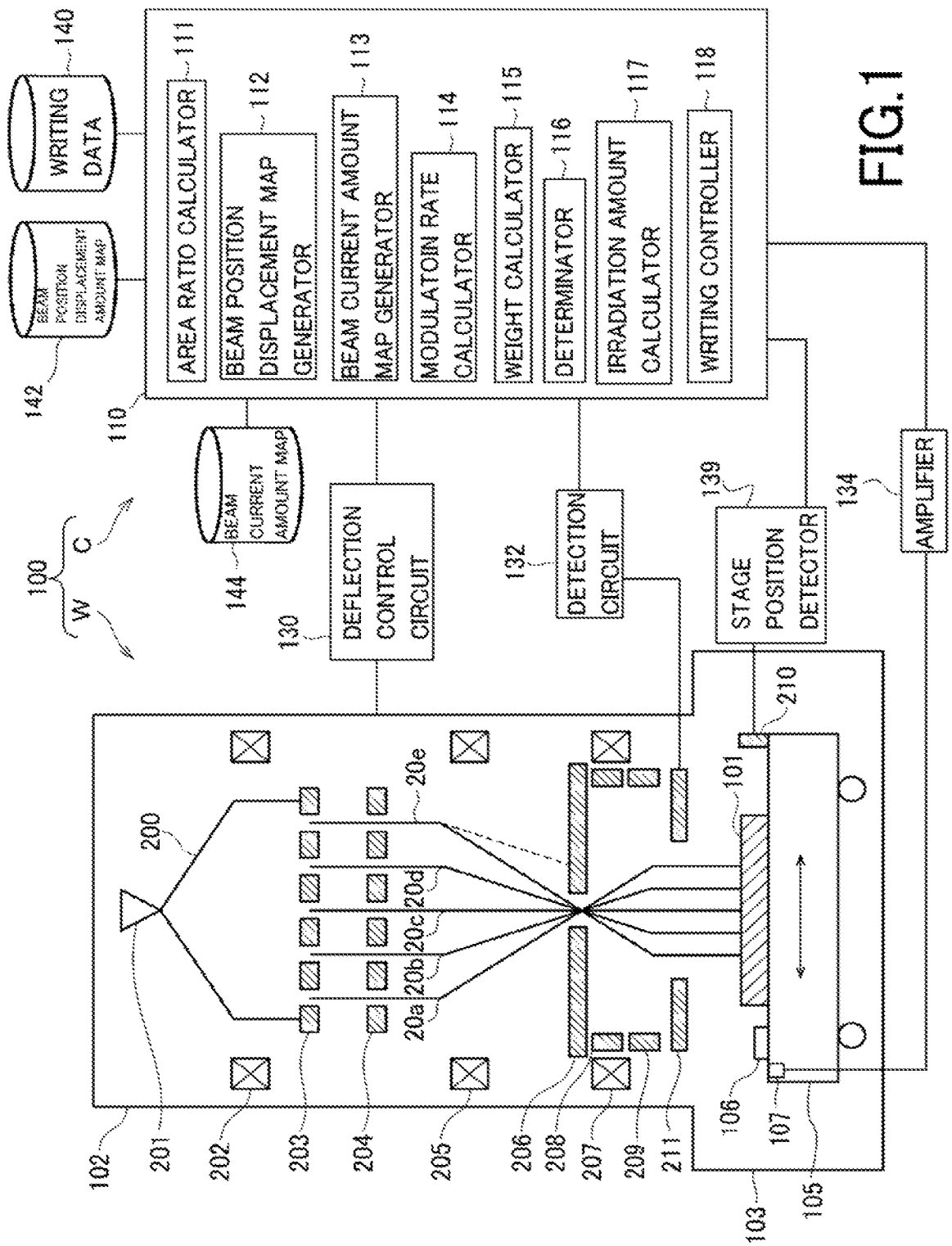
FIG. 1 is a schematic diagram of a multi charged particle beam writing apparatus according to an embodiment of the present invention.

FIG. 1 is a schematic configuration diagram of a writing apparatus according to an embodiment. As shown in FIG. 1, a writing apparatus 100 includes a writer W and a controller C. The writing apparatus 100 is an example of a multi charged particle beam writing apparatus. The writer W includes an electron column 102 and a writing chamber 103. In the electron column 102, an electron gun 201, an illuminating lens 202, a shaping aperture member 203, a blanking plate 204, a reducing lens 205, a limiting aperture member 206, an objective lens 207, deflectors 208, 209, and a detector 211 are disposed, which form a multi-beam generation mechanism.

An XY stage 105 is placed in the writing chamber 103. A substrate 101 as a writing target is placed on the XY stage 105. The substrate 101 is, for instance, a mask blank or a semiconductor substrate (silicon wafer).

On the XY stage 105, a mark 106, a Faraday cup 107, and a mirror 210 for position measurement are placed. An output of the Faraday cup 107 is outputted to a control computer 110 via an amplifier 134.

The controller 160 has a control computer 110, a deflection control circuit 130, a detection circuit 132, an amplifier 134, a stage position detector 139, and memories 140, 142, 144. Writing data is inputted to the memory 140 from the outside, and is stored therein. Normally, the writing data define information on multiple figure patterns for writing. Specifically, a graphic code, coordinates, and a size are defined for each of the figure patterns.

The control computer 110 includes an area ratio calculator 111, a beam position displacement map generator 112, a beam current amount map generator 113, a modulation rate calculator 114, a weight calculator 115, a determinator 116, an irradiation amount calculator 117, and a writing controller 118. Each component of the control computer 110 may be comprised of hardware, such as an electrical circuit, or may be comprised of software, such as a program, which implements these functions. Alternatively, the component may be comprised of a combination of hardware and software.

The stage position detector 139 emits a laser, receives reflection light from the mirror 210, and detects the position of the XY stage 105 by a laser interferometry method.

Figure 2:
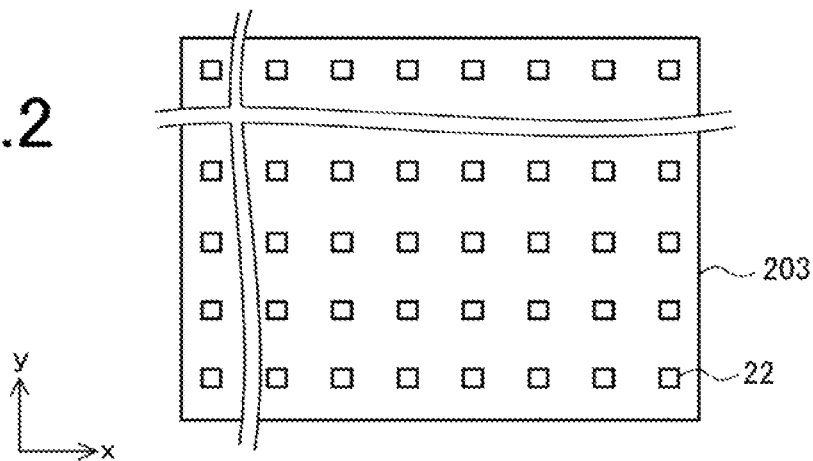
FIG. 2 is a plan view of a shaping aperture member.

FIG. 2 is a conceptual view showing the configuration of the shaping aperture member 203. As shown in FIG. 2, in the shaping aperture member 203, openings 22 with m vertical (y direction) rows×n horizontal (x direction) columns (m, n≥2) are formed with a predetermined arrangement pitch. The openings 22 are formed of rectangles in the same dimensional shape. The openings 22 may be circles with the same outer diameter. Part of electron beams 200 pass through these openings 22, thereby forming multi-beam (multiple beams) 20a to 20e.

In the blanking plate 204, passage holes are formed according to the arrangement positions of the openings 22 of the shaping aperture member 203. A set of two electrodes as a pair (blanker) is disposed at each passage hole. An electron beam which passes through each passage hole is independently controlled to be in a beam-on or beam-off state for each beam by a voltage applied to the blanker. In the beam-on state, the opposing electrodes of the blanker are controlled at the same potential, and the blanker does not deflect the beam. In the beam-off state, the opposing electrodes of the blanker are controlled at different potentials, and the blanker deflects the beam. In this manner, multiple blankers perform blanking deflection on corresponding beams among the multi-beam which have passed through the multiple openings 22 of the shaping aperture member 203.

The electron beam 200 discharged from the electron gun 201 (discharger) illuminates the entire shaping aperture member 203 substantially perpendicularly by the illuminating lens 202. The electron beam 200 illuminates a region including all the openings 22. The electron beam 200 passes through the multiple openings 22 of the shaping aperture member 203, thereby forming multiple electron beams (multi-beam) 20a to 20e, in a rectangular pattern, for instance.

The multi-beam 20a to 20e pass through respective corresponding blankers of the blanking plate 204. The blankers respectively deflect the passing electron beams individually. The multi-beam 20a to 20e, which have passed the blanking plate 204, are reduced by the reducing lens 205, and pass through ideally the same point on the limiting aperture member 206 in an on state of all beams. The orbit of the beams is adjusted by an alignment coil (not illustrated) so that the point is located in an opening at the center of the limiting aperture member 206.

Here, a beam controlled in a beam-off state is deflected by a blanker of the blanking plate 204 to move along a trajectory outside the opening of the limiting aperture member 206, thus is blocked by the limiting aperture member 206. On the other hand, a beam controlled in a beam-on state is not deflected by a blanker, thus passes through the opening of the limiting aperture member 206. In this manner, on/off of a beam is controlled by blanking control of the blanking plate 204.

The limiting aperture member 206 blocks the beams which are deflected so as to be in a beam-off state by multiple blankers. The multi-beam for one shot is formed by the beam which has passed through the limiting aperture member 206 and formed in a period from beam-on until beam-off is achieved.

The multi-beam which has passed through the limiting aperture member 206 is focused by the objective lens 207, and projected on the substrate 101 with a desired reduction ratio. The deflectors 208, 209 each deflect the entire multi-beam in the same direction and distance. The deflection amounts of the deflectors 208, 209 are controlled independently. The irradiation position of the multi-beam on the substrate 101 is controlled by the deflectors 208, 209.

During writing, the XY stage 105 is controlled so as to be moved continuously at a constant speed. The irradiation position of the beam is controlled by the deflector 208 so that the irradiation position follows the movement of the XY stage 105. The multiple beams emitted simultaneously are ideally arranged with the pitch which is the product of the arrangement pitch of the multiple openings of the shaping aperture member 203 and the above-mentioned desired reduction ratio. During the writing, a writing operation in a raster scan method for exposing all the pixels defined on the substrate 101 is performed with the multi-beam by position control using deflection. When a beam is on a pixel not including a pattern, the beam is controlled at a beam-off by the blanking control.

Figure 3:
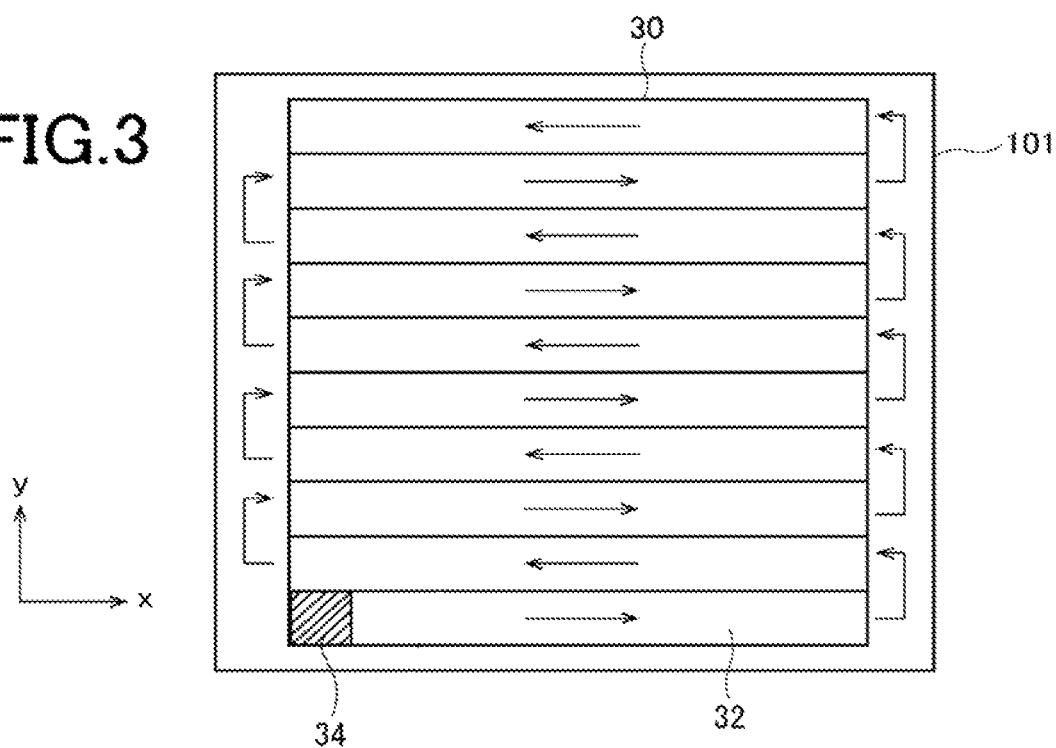
FIG. 3 is a view illustrating an example of a writing operation.

FIG. 3 is a conceptual view illustrating a writing operation in the embodiment. As shown in FIG. 3, a writing region 30 on the substrate 101 is virtually divided into multiple rectangular stripe regions 32 with a predetermined width in the y direction (first direction). When these stripe regions are written, first, the XY stage 105 is moved, an irradiation region (beam array) 34 which can be irradiated with a beam for one time is adjusted to be located at the left end of the first stripe region 32, and writing is started.

When writing is performed on the first stripe region 32, the XY stage 105 is moved continuously in −x direction at a constant speed, and writing is thereby performed on the substrate 101 relatively in +x direction. After the writing on the first stripe region 32 is performed, the XY stage 105 is stopped. Next, the stage position is moved in −y direction by the stripe width, and the beam array 34 is adjusted to be located at the right end of the second stripe region 32. Subsequently, writing is performed on the substrate 101 in −x direction by moving the XY stage 105 continuously in +x direction at a constant speed.

In the third stripe region 32, writing is performed in +x direction, and in the fourth stripe region 32, writing is performed in −x direction. Writing may be performed on each stripe region 32 in the same direction, but in that case, the writing time is increased because an operation to return the stage position is additionally performed.

Figure 4:
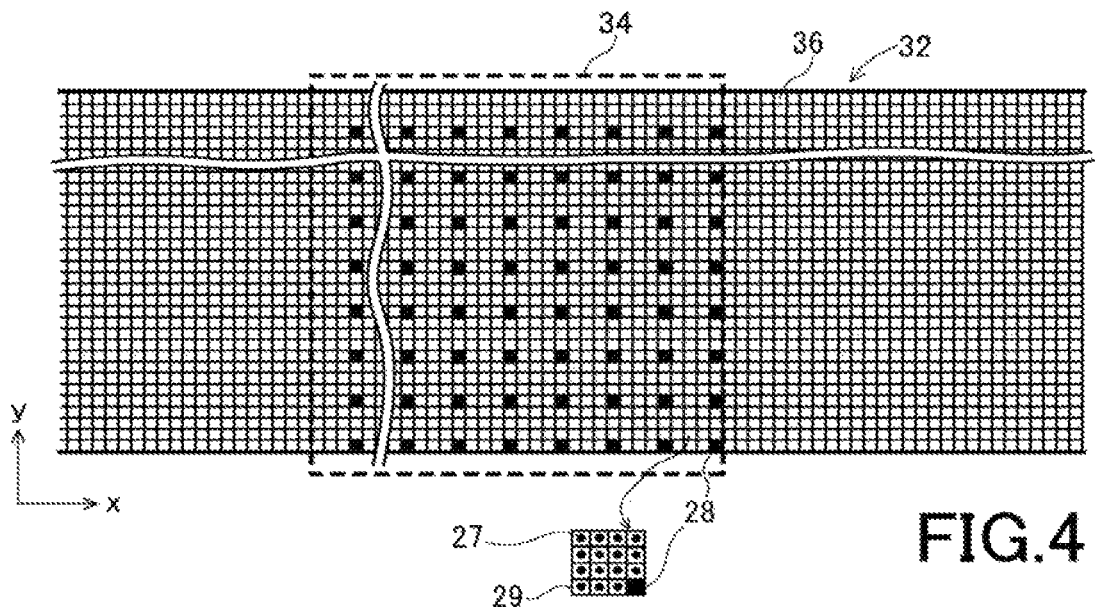
FIG. 4 is a view showing an example of an irradiation region and writing target pixels for a multi-beam.

FIG. 4 is a view showing an example of an irradiation region and writing target pixels for a multi-beam. In FIG. 4, on the stripe region 32, multiple control grids 27 are set, which are arranged on the substrate 101 in a lattice pattern with the pitch of the beam size, for instance. For instance, the arrangement pitch is preferably approximate 10 nm.

The multiple control grids 27 provide ideal irradiation positions (ideal positions) without a position displacement of the multi-beam. The arrangement pitch of the control grids 27 is not limited to the same size as the beam size, and may be any size which is controllable as a deflection position of the deflector 209. Then multiple pixels 36, which are virtually divided in a mesh pattern with a pitch size same as the arrangement pitch of the control grids 27 centered on each control grid 27, are each set.

Each pixel 36 is an irradiation unit region per beam of the multi-beam. The example of FIG. 4 shows the case where the writing region of the substrate 101 is divided into multiple stripe regions 32 in the y direction with a width size same as the size of the beam array 34 (writing field) which can be irradiated with the multi-beam for one time. The size of the beam array 34 in the x direction is the product of the pitch between beams of the multi-beam in the x direction and the beam counts in the x direction, and the size of the beam array 34 in the y direction is the product of the pitch between beams of the multi-beam in the y direction and the beam counts in the y direction.

FIG. 4 shows an example of a multi-beam in 8×8 columns. It is to be noted that the multi-beam is not limited to 8×8 columns, and 512×512 columns or the like may be used as needed. Then, in the beam array 34, multiple pixels 28 (irradiation positions of the beam), which can be irradiated with a single shot of a multi-beam, are shown as black-colored pixels. In other words, the pitch between adjacent pixels 28 is the design pitch of between beams of the multi-beam. Here, let a sub-irradiation region 29 be the region in the size of the beam pitch. In the example of FIG. 4, each sub-irradiation region 29 is formed of 4×4 pixels.

When writing is performed on each stripe region 32, a raster scan method is used, in which while the XY stage 105 is moved in the x direction, the beam array is deflected so that a pixel exposed in each shot is moved (scanned) in the y direction by the deflector 209, and irradiation with a shot beam is continuously made sequentially.

When writing is performed on each stripe region 32, concurrently with the continuous movement of the XY stage 105 in the x direction, the beam position is controlled by the deflector 208 and all the pixels on the substrate 101 are exposed the same number of times. At this point, the deflector 208 performs switching control between pixels to be exposed, and deflection control (stage tracking) of the beam position so that the beam during exposure follows the continuous movement of the substrate 101. When switching between pixels to be exposed is performed, the deflector 208 deflects the beam array in the range of the sub-irradiation region 29. This operation is the writing method called raster san mentioned earlier, and a specific example is shown in FIG. 5.

Figure 5:
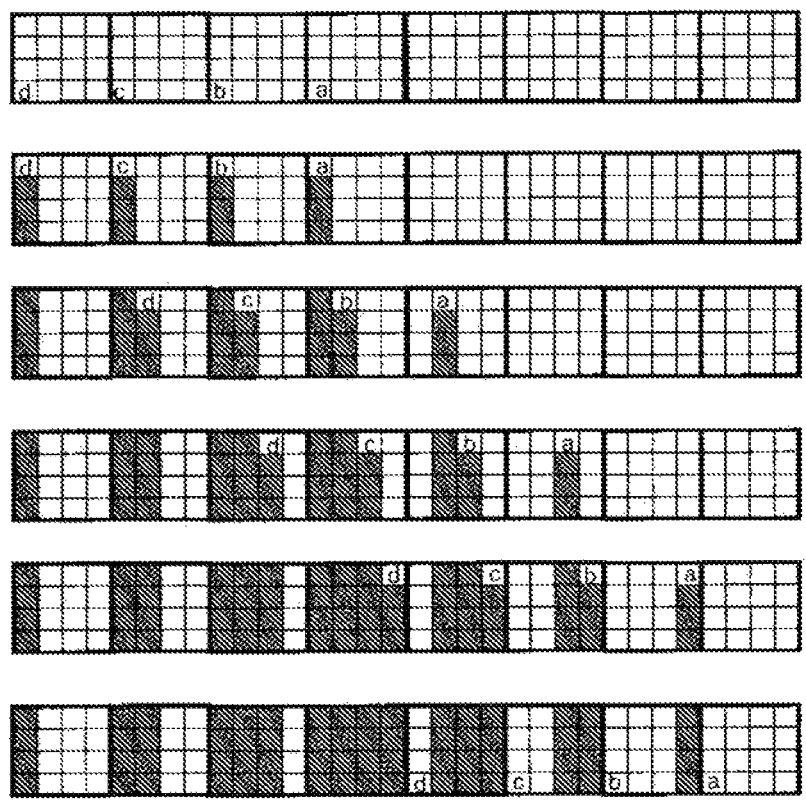
FIG. 5 is a view illustrating an example of a writing operation.

FIG. 5 shows an example in which four multi-beams are present in the x direction, and arranged with an interval which is four times the beam size. The multi-beams in four rows or a different number of rows may be present in the y direction, however, since the multi-beam in each row performs writing on a region with a beam pitch width corresponding to the sub-irradiation region 29, FIG. 5 may be considered to indicate the beam arrays in certain rows among the beam arrays in multiple rows, and the pixels to be exposed by these beam arrays.

The example of FIG. 5 shows during the continuous movement of the stage in −x direction, repeat of process of exposing each beam in one column consisting of four pixels in the y direction, and exposing another column after movement of the beam in +x direction. As described above, during exposure of four pixels in one column by each beam, the deflector 208 performs a stage tracking operation to make continuous change according to the movement of the stage so that the position of the beam array on the substrate 101 in the x direction is unmoved, and concurrently, the deflector 209 applies deflection for changing the pixels to be exposed to ones in the y direction. A major movement of the beam in +x direction after exposure of one column is made by an operation of tracking reset to stop the stage tracking and return the deflection amount of the deflector 208 to the deflection amount at the time of start of the stage tracking.

In FIG. 5, the groups of pixels are partitioned into the regions with the beam pitch width, and when a beam is moved to another column, the beam is moved to another region with the pitch width. The movement is performed by the deflector 209 controlling the deflection amount applied in the x direction. In other words, the deflector 208 performs tracking deflection, and the deflector 209 performs deflection within the sub-irradiation region 29, thereby performing a raster scan operation. It is to be noted that in the exposure process shown in FIG. 5, only partial pixels are exposed in up to the third region with the pitch width, and all the pixels in further regions with the pitch width on the right are exposed by further repeating the above-mentioned process. In other words, immediately after the start of exposure, exposure is incomplete in three beam pitch regions, thus the writing operation is started from a region on the left of the writing region in advance so that actual writing region does not overlap with these regions.

Figure 6:
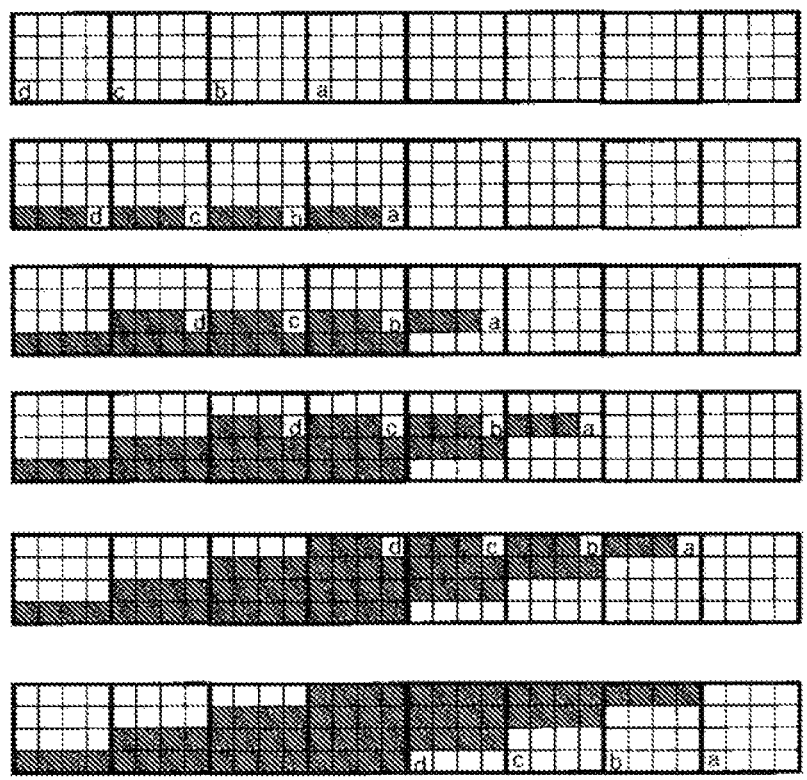
FIG. 6 is a view illustrating an example of a writing operation.

In this example, during the tracking period, multiple pixels are sequentially exposed in +y direction. However, without being limited to this, multiple pixels may be sequentially exposed in +x direction as shown in FIG. 6, for instance.

For multi-beam writing, similarly to single beam writing, in order to average the position for each beam and an error in the current amount (beam intensity) of each beam, it is preferable to perform multiple writing in which writing (exposure) is performed in multiple divided necessary irradiation amount.

Figure 7A:
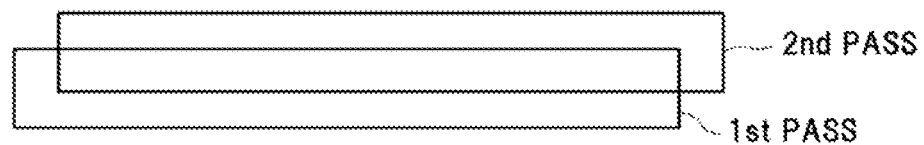
FIGS. 7A and 7B are views showing an example of a writing method of multiple writing.

For instance, a technique called "multi-pass multiple writing" is known, in which multiple writing is performed so that a stripe is completely or partially overlapped with other stripes. FIG. 7A shows an example in which writing is performed so that a stripe is partially overlapped with other stripes by shifting the X coordinates and the Y coordinates of the stripe region by the distance which is half the width of the stripe region. In the example shown in FIG. 7A, one region is exposed twice, thus the multiplicity is 2.

Figure 7B:
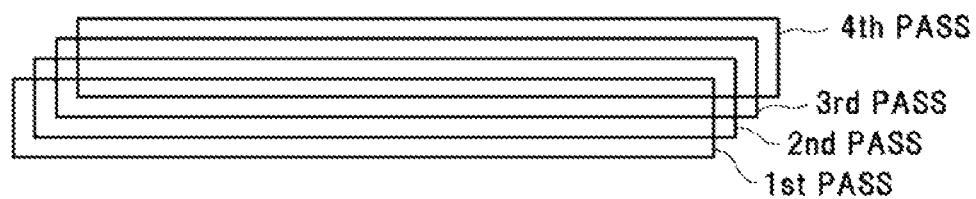

FIG. 7B shows an example of multi-pass multiple writing with a multiplicity of 4. In this example, the stripe of (N+1)th pass is shifted from the stripe of Nth pass in +X direction, +Y direction by the distance which is one fourth the width of the stripe region. In contrast to FIG. 7A, the positional relationship between the stripes belonging to each pass is such that, for instance, in the 1st pass, the kth stripe is set at the position shifted from the (k−1)th stripe by the stripe width in +Y direction. The same is applied to the stripes belonging to each of other passes. In the example shown in FIG. 7B, writing is performed on one region four times, thus the multiplicity is 4.

Also, a technique called "in-pass multiple writing" is known, in which the beam array is divided into multiple regions with a same predetermined width in the x direction (writing movement direction), and during writing on one stripe region, the beams for the divided regions perform writing on the same location.

Figure 8A:
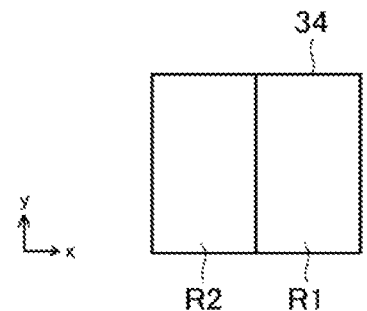
FIGS. 8A to 8D are views showing an example of a writing method of multiple writing.
Figure 8B:
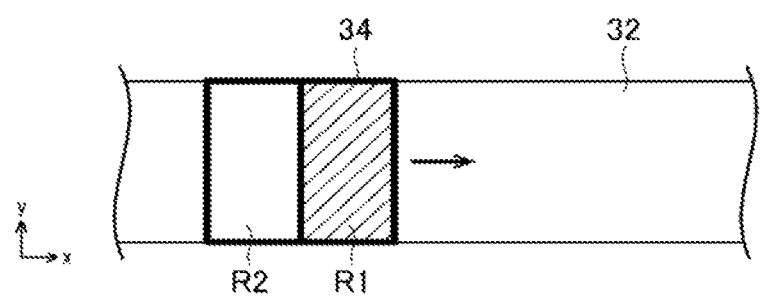
Figure 8C:
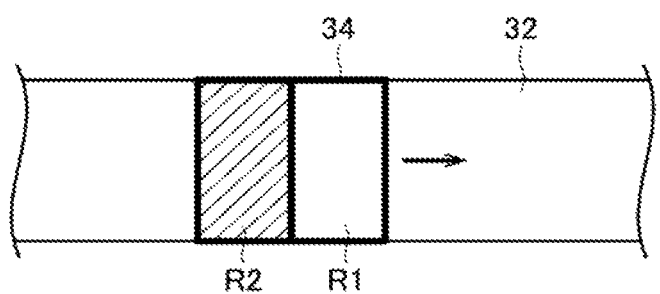

For instance, as shown in FIG. 8A, the beam array 34 is divided into two sub-beam arrays: a region R1 and a region R2. As shown in FIG. 8B, FIG. 8C, the region shaded in the figures is irradiated with the beam for the region R1, then is irradiated with the beam for the region R2. Therefore, writing is performed on one region twice, thus the multiplicity is 2.

Figure 9:
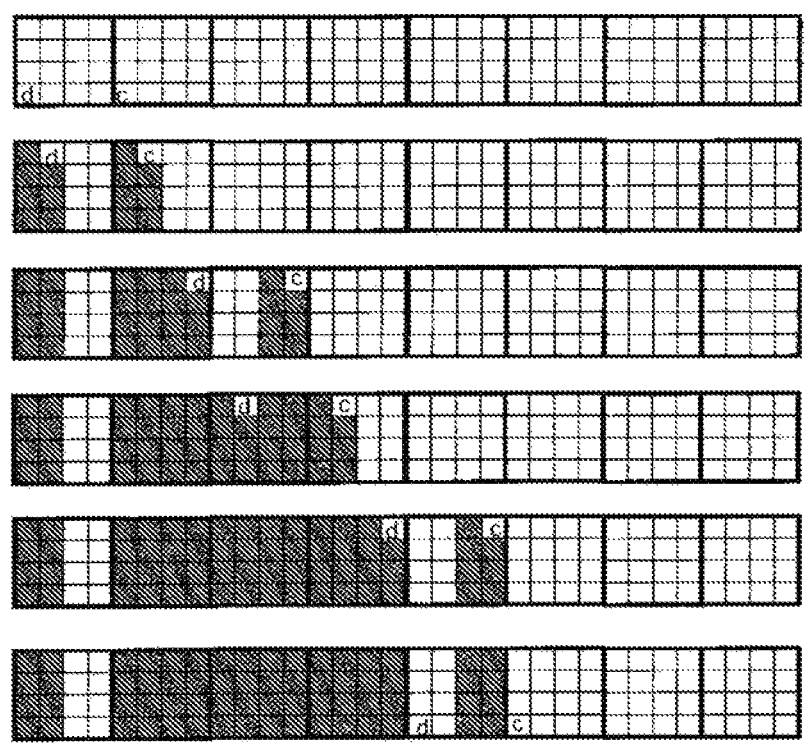
FIG. 9 is a view illustrating an example of a writing operation.

The raster scan method in this case is shown in FIG. 9. In this example, exposure is performed by two beams (c, d) arranged with a pitch of four pixels in the X direction. Two pixel columns each consisting of four pixels in the Y direction are exposed, and exposure of two pixel columns in regions with another beam pitch width is repeated, then all the pixels are thereby exposed by two beams (c, d).

When four beams are arranged with a pitch of four pixels in the X direction, exposure can be performed as shown in FIG. 9 with two beams (a, b) different from the (c, d) shown in FIG. 9 concurrently with the exposure with the beams (c, d). In this case, during the writing on a stripe, pixels exposed with beams on the upstream side, for instance, the beams (a, b) in the stage movement direction, are exposed with the beams (c, d) on the downstream side again, thus all the pixels in the stripe are exposed twice. In other words, by controlling the beam array with divided into halves in the X direction, all the pixels are exposed twice. In this example of FIGS. 8A to 8C, the beams (a, b) belong to the region R1 and the beams (c, d) belong to the region R2.

Figure 8D:
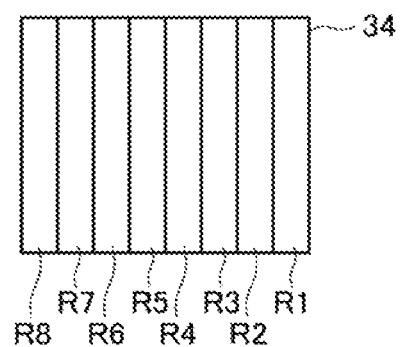

As shown in FIG. 8D, when the beam array 34 is divided into eight regions R1 to R8, the multiplicity of multiple writing is 8.

As described later, in the present embodiment, either one of the "multi-pass multiple writing" and the "in-pass multiple writing", or multiple writing in a combination of "multi-pass multiple writing" and the "in-pass multiple writing" is performed.

Figure 10:
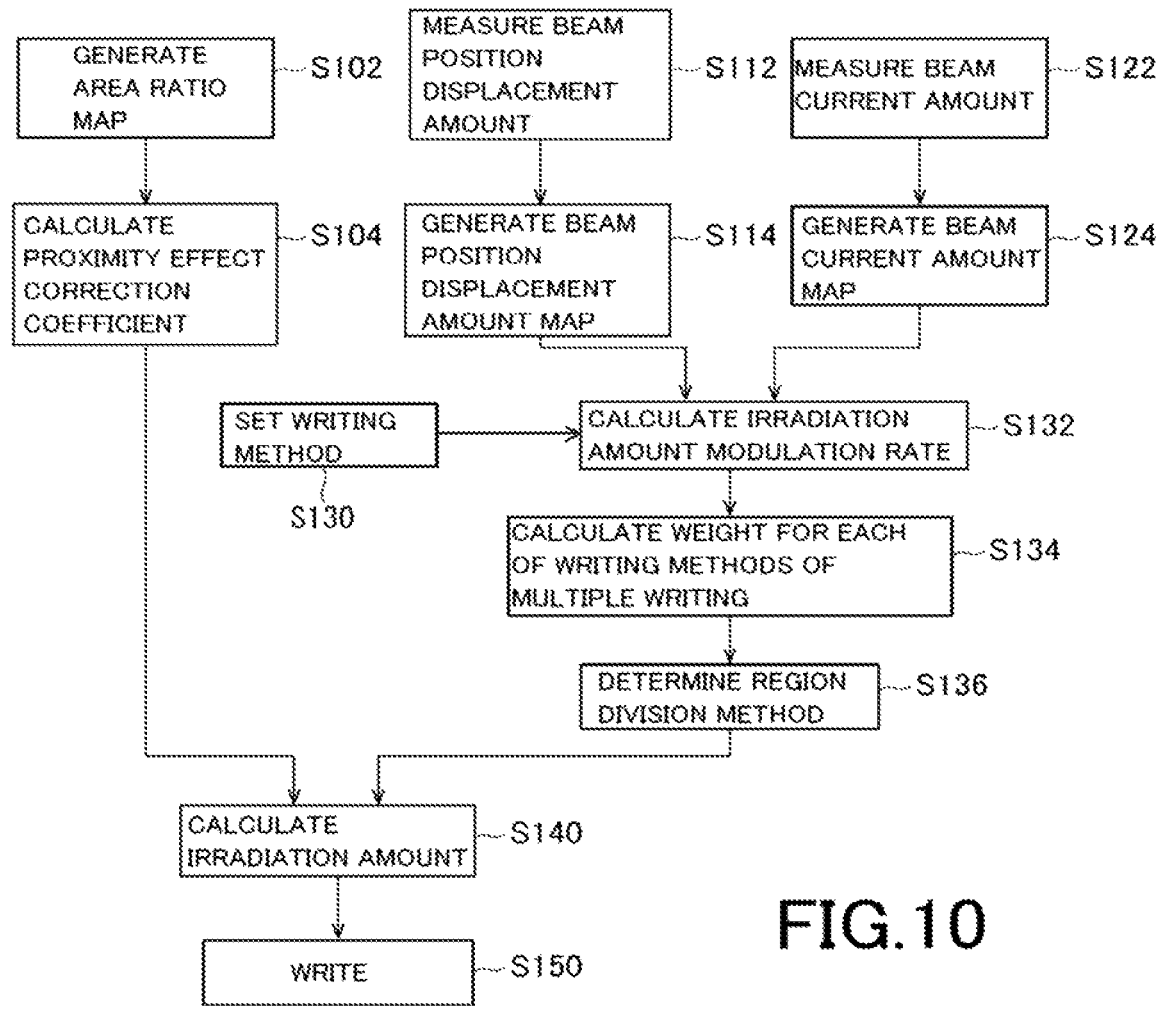
FIG. 10 is a flowchart illustrating a writing method according to the embodiment.

FIG. 10 is a flowchart illustrating a writing method according to the present embodiment.

In an area ratio map generation step (S102), the area ratio calculator 111 reads writing data from the memory 140, and for each pixel 36, calculates a pattern area density $\rho(x)$ in the pixel 36, then generates an area ratio map. This processing is executed for each stripe region 32, for instance.

In a proximity effect correction coefficient calculation step (S104), the area ratio calculator 111 first virtually divides a writing region (here, for instance, the stripe region 32) into multiple proximity mesh regions (mesh regions for proximity effect correction calculation) in a mesh pattern in a predetermined size. The size of the proximity mesh regions is preferably set to $\frac{1}{10}$ of the influence range of the proximity effect, for instance, approximately 10 μm. The area ratio calculator 111 reads writing data from the memory 140, and for each proximity mesh region, calculates a pattern area density $\rho'$ of a pattern disposed in the proximity mesh region.

Next, for each proximity mesh region, the area ratio calculator 111 calculates a proximity effect correction coefficient $Dp(x)$ (correction irradiation amount) for correcting the proximity effect. An unknown proximity effect correction coefficient $Dp(x)$ can be defined by a threshold model for proximity effect correction, which is similar to a conventional method using a backscattering coefficient $\eta$, an irradiation amount threshold Dth for the threshold model, a pattern area density $\rho'$, and a distribution function $g(x)$.

Thus calculated pattern area density $\rho(x)$ of each pixel 36 and the proximity effect correction coefficient $Dp(x)$ are used in the later-described irradiation amount calculation step (S140).

In a beam position displacement amount measurement step (S112), the writing apparatus 100 measures an amount of position displacement from the control grid 27 corresponding to each beam of the multi-beam.

When writing processing is performed, it is ideal that the irradiation positions in a lattice pattern with a beam pitch width be irradiated with respective beams. However, actually, the beam irradiation position of each beam is displaced from an ideal position due to various rates, such as an aberration in an optical system.

Thus, the position displacement amounts of the irradiation positions of individual beams are measured. For instance, part of the multi-beam is grouped, the mark 106 provided on the XY stage 105 is scanned using the deflector 208 or the deflector 209, and electrons reflected by the mark 106 are detected by the detector 211. For each deflection amount at the time of scan, the detection circuit 132 notifies the control computer 110 of the detected electron amount. The control computer 110 obtains a scan waveform from the detected electron amount and deflection amount, and calculates the position of the grouped beam with reference to the position of the XY stage 105. The position of the XY stage 105 is detected by the stage position detector 139. Other beams of the multi-beam are grouped, and the position of the beams is calculated by a similar method. By repeating this, the beam position can be determined for each grouped beams. When the position displacement amount of the beams has a systematic distribution, the position displacement amount for each beam can be determined by complementing the position displacement amount for each grouped beams.

The difference between the calculated beam position and the ideal position gives the position displacement amount of the beam. In a beam position displacement amount map generation step (S114), the beam position displacement map generator 112 generates a beam position displacement amount map that defines the position displacement amount of each beam. The beam position displacement amount map is stored in the memory 142.

The beam position displacement amount may be measured by irradiating an evaluation substrate coated with a resist with a multi-beam, and measuring the position of a resist pattern by a position measuring instrument, the resist pattern being generated by developing the evaluation substrate. When the shot size of each beam makes it difficult to measure a resist pattern using a position measuring instrument, a figure pattern (for instance, a rectangular pattern) is written in a size which can be measured with each beam or multiple beams in proximity by a position measuring instrument. The edge positions on both sides of the written figure pattern (resist pattern) are measured, and the position displacement amount of a target beam is measured from the difference between the intermediate position between the both edges and the design intermediate position of the figure pattern.

In a beam current amount measurement step (S122), the Faraday cup 107 is irradiated with each beam of the multi-beams one by one by the control of the writing controller 118, and the current amount of each beam is measured. The beam current amounts of individual beams of the multi-beams are not uniform, which depend on the distribution of the current density of the beam with which the shaping aperture member is irradiated and on the variation and distribution of the openings of the shaping aperture member. Thus, it is necessary to determine the current amount for each beam, and correct the difference thereof with an exposure time. It is sufficient that the blanking plate 204 be operated so that a target beam is set beam-on, and other beams are set beam-off. Multiple beams in proximity may be set on simultaneously, and the total of current amounts may be measured. As described above, the irradiation position of each beam has a position displacement amount, however, the entrance of the Faraday cup 107 is sufficiently larger than the size of the beam array normally, thus the measurement is not influenced.

In a beam current amount map generation step (S124), the beam current amount map generator 113 generates a beam current amount map which has a map value of the current amount of each beam measured. The generated beam current amount map is stored in the memory 144.

Next, in a writing method setting step (S130), a writing method is set. The setting items of the writing method include the method of multiple writing mentioned earlier, the number of passes, presence or absence of displacement of a stripe between passes and the displacement manner, the multiplicity in each pass, the stage movement direction for each pass, the deflection sequence by raster scan. By setting the writing method, the number of times of exposure of the pixels on the substrate 101, and which one of the multi-beams performs exposure are determined for each exposure.

Next, in an irradiation amount modulation rate calculation step (S132), for each exposure of multiple writing of each beam, the modulation rate calculator 114 calculates a modulation rate of the exposure time of a corresponding beam. Here, the modulation rate is calculated from the beam position displacement amount map, and the beam current amount map as follows: from the relationship between the beam position displacement amount map and the beam for each exposure of multiple writing on each pixel, irradiation amount correction calculation is performed for eliminating the effect of beam position displacement on the dose distribution received by the substrate 101, and a modulation rate of the irradiation amount for position displacement correction is calculated for each exposure of multiple writing on each pixel. For each exposure of multiple writing on each pixel, the modulation rate calculator 114 determines the current amount of beam for exposure of each pixel by referring to the beam current amount map, and calculates a modulation rate of the exposure time for correcting the current amount of beam.

Next, for each exposure of multiple writing on each pixel, the modulation rate calculator 114 multiplies the modulation rate of the irradiation amount for correcting the position displacement of each beam by the modulation rate of the exposure time for correcting the current amount of beam, thereby calculating the modulation rate of the exposure time for each exposure of multiple writing on each pixel. These are used when the correction irradiation amount for each beam is determined. Specifically, the exposure time for each beam is obtained by dividing the modulation rate of the irradiation amount by the current amount of beam, and by multiplying this by the modulation rate of the irradiation amount and the modulation rate of the exposure time, a correction irradiation amount is obtained, in which the position displacement of the beam and the current amount for each beam are corrected. From the modulation rate of the irradiation amount and the modulation rate of the exposure time which are calculated by the modulation rate calculator, for each stripe, it is possible to determine a maximum value of the modulation rate of the exposure time of each beam, that is, a maximum value of the product of the modulation rate of the irradiation amount and the modulation rate the exposure time. Hereinafter, that modulation rate is called the modulation rates of the irradiation time of each beam.

In multi-beam writing, a number of pixels 28 are each irradiated with a beam in one shot, the number being equal to the number of beams in a multi-beam. After a predetermined time T has elapsed since the start of the first shot, the irradiation position is shifted (to the adjacent pixel 28, for instance), and the second shot is started. After the predetermined time T has elapsed since the start of the second shot, the irradiation position is shifted (to the further adjacent pixel 28, for instance), and the third shot is started. The predetermined time T is determined by the longest irradiation time among the irradiation times of a great number of beams forming a multi-beam in one shot. In addition, when writing control is performed for maintaining the stage speed during writing on a stripe at a constant speed, the predetermined time T is determined by the longest irradiation time among the irradiation times of the beams of all the shots in the stripe.

The irradiation time of each beam varies with a pattern density and a modulation amount of proximity effect correction, and varies depending on the distribution of the current density on the beam array surface of the multi-beam and the beam position displacement. When the current density of the outer peripheral portion of the beam array of the multi-beam is low or the beam position displacement amount is large, the longest irradiation time of each beam is higher in the outer peripheral portion than in the central portion.

For instance, even when a small number of beams have a high modulation rate, and many other beams have a low modulation rate among multiple beams forming the multi-beam, the predetermined time T is determined according to the irradiation time calculated from the maximum modulation rate, and reduction in the writing throughput is caused.

Thus, in the present embodiment, the beam array 34 is divided into multiple regions (sub-beam arrays) so that a first region including beams having a high modulation rate and a second region including beams having a low modulation rate are separated. Weighting is performed to decrease the modulation rate for the first region, and weighting is performed to increase the modulation rate for the second region so that the modulation rates of the first region and the second region are approximately equal. Multiple writing of a pattern is performed with the beams of the first region and the beams of the second region. Consequently, the maximum irradiation amount in the stripe can be reduced while maintaining the sum of the irradiation amounts given to the grids by the beams of the first region and the beams of the second region in multiple writing. In addition, the predetermined time T is shortened, thus the writing throughput can be improved. In particular, when writing control is performed for maintaining the stage speed to a constant speed during stripe writing, the effect is significant.

Figure 11:
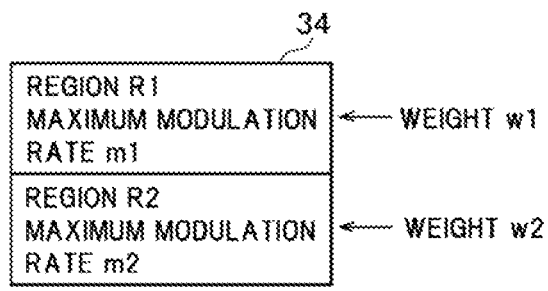
FIG. 11 is a chart showing an example of weighting of modulation rates.
Figure 12:
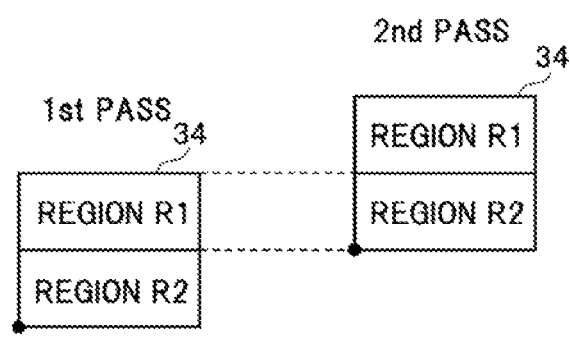
FIG. 12 is a chart showing an example of a writing method of multiple writing.

For instance, as shown in FIG. 11, a case is considered, in which the beam array 34 is divided into halves in a vertical direction, a maximum modulation rate m1 in the sub-beam array of the upper half region R1 is higher than a maximum modulation rate m2 in the sub-beam array of the lower half region R2. In this case, weighting with a weight w1 is applied to the region R1 to decrease the modulation rate, weighting with a weight w2 is applied to the region R2 to increase the modulation rate, and multi-pass multiple writing with the number of passes of 2 is performed as shown in FIG. 12. Here, the reference point of the beam array 34 is indicated by a black circle. The sub-stripe in which the sub-beam array of the region R1 is exposed in the first pass is overlapped with the sub-stripe in which the sub-beam array of the region R2 is exposed in the second pass. This is a writing technique similar to the writing as shown in FIG. 7A performed by shifting the X coordinates and the Y coordinates of the stripe region by the distance which is half the width of the stripe region. The weights w1, w2 are set so that the average is equal to 1.

For instance, the weight can be determined from the mathematical expression (1) below. The mathematical expression (1) calculates the weight for each region from the modulation rate in each of the multiple regions into which the beam array 34 is divided, and the multiplicity of multipass multiple writing so that the average is equal to 1 and the difference of the maximum modulation rates between the regions is reduced by the weighting. The higher the modulation rate is, the lower the weight is. The weight for the region having the highest modulation rate among the multiple regions divided in the beam array 34 is smaller than 1, and the weight for the region having the lowest modulation rate is greater than 1. Here, when weighting is performed on the weight using the maximum modulation rate in each of the multiple regions, the effect of reducing the difference of the maximum modulation rates between the regions is maximized by the weighting. However, weighting is not limited to this. For instance, weighting may be performed using the average value of the respective modulation rates of the multiple regions.

$$w_k = \frac{N\left(\prod_{j=1}^{N} m_j\right)/m_k}{\sum_{i=1}^{N}\left[\left(\prod_{j=1}^{N} m_j\right)/m_i\right]}$$

N: Multiplicity ( = the number of overlapped regions)

In this example, the multiplicity N=2, thus w1=2×m2/(m1+m2), w2=2×m1/(m1+m2). When m1=1.5, m2=1.2, weighting using w1=0.89, w2=1.11 is performed.

The maximum modulation rate M1 of the region R1 after the weighting is M1=w1×m1=1.335. The maximum modulation rate M2 of the region R2 after the weighting is M2=w2×m2=1.332. It is seen that by the weighting, the maximum modulation rate in the beam array 34 can be reduced from 1.5 to 1.335, and the writing time can be improved (shortened) by 11%.

Figure 13:
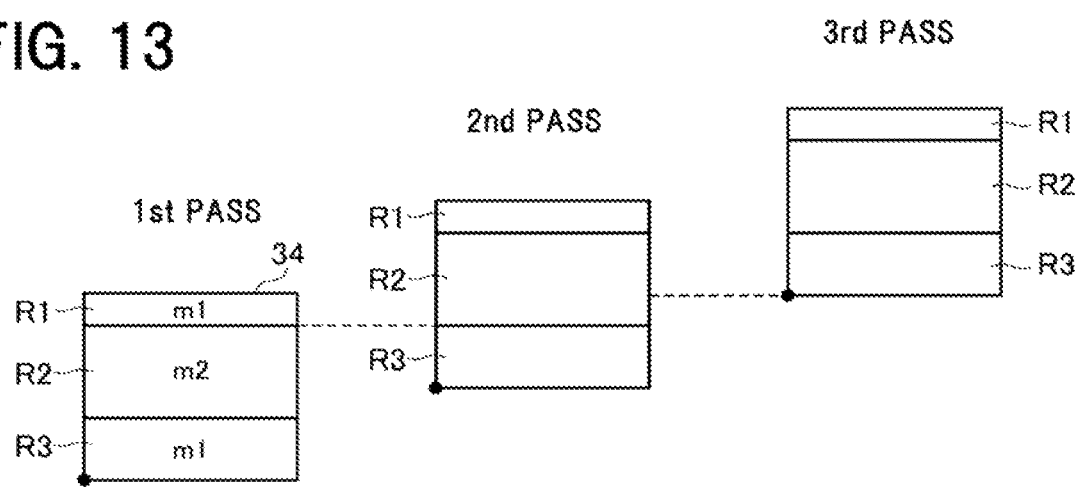
FIG. 13 is a chart showing an example of a writing method of multiple writing.

FIG. 13 shows an example in which the beam array 34 is divided into three regions R1 to R3 in a vertical direction, and multi-pass multiple writing with a multiplicity of 2 is performed so that the sub-stripe for which writing is performed with the sub-beam array of the regions R1, R3 is overlapped with the sub-stripe for which writing is performed with the sub-beam array of the region R2. Region division is performed so that the total of the vertical widths of the regions R1, R3 is equal to the vertical width of the region R2.

The regions R1 and R3 are treated as the same region in the sense that the regions R1 and R3 use the same weight because the sub-stripe for which writing is performed with the sub-beam array of the region R1 and the sub-stripe for which writing is performed with the sub-beam array of the region R3 are both overlapped with the sub-stripe for which writing is performed with the sub-beam array of the region R2. Thus, the higher value between the maximum modulation rate of the region R1 and the maximum modulation rate of the region R3 is set to the maximum modulation rate of the regions R1 and R3. It is assumed that the maximum modulation rate m2 of the region R2 is smaller than m1. In this case, weighting using the weight w1 to decrease the modulation rate is performed on the regions R1, R3, and weighting using the weight w2 to increase the modulation rate is performed on the region R2.

FIG. 14 shows an example in which the beam array 34 is divided into four regions R1 to R4 in a vertical direction, the maximum modulation rates in the regions R1 to R4 are respectively m1 to m4, m1, m4 are high, and m2, m3 are low. In this case, weighting using the weights w1, w4 to decrease the modulation rate is performed on the regions R1, R4, and weighting using the weights w2, w3 to increase the modulation rate is performed on the regions R2, R3, and in addition, as shown in FIG. 14, multi-pass multiple writing with a multiplicity of 2 is performed so that the sub-stripe for which writing is performed with the sub-beam array of the regions R1, R4 is overlapped with the sub-stripe for which writing is performed with the sub-beam array of the regions R2, R3.

Since the multiplicity N=2, from the above-mentioned mathematical expression (1), w1=2×m3/(m1+m3), w2=2×m4/(m2+m4), w3=2×m1/(m1+m3), w4=2×m2/(m2+m4).

For instance, when m1=1.5, m2=1.2, m3=1.1, m4=1.3, the weights are w1=0.8, w2=1.1, w3=1.2, w4=0.9. The maximum modulation rates M1 to M4 of the regions R1 to R4 after the weighting are M1=1.2, M2=1.32, M3=1.32, M4=1.17. It is seen that by the weighting, the maximum modulation rate in the beam array 34 can be reduced from 1.5 to 1.32, and the writing time can be improved by 12%.

In the example shown in FIG. 14, the beam array 34 is region-divided finely, and multiple writing is performed so that among the multiple regions, the region R1 with the maximum modulation rate is overlapped with the region R3 with the minimum modulation rate. Thus, the maximum modulation rate m1 of the region R1 can be effectively reduced.

FIG. 15 shows an example in which region division is performed in the same manner as in FIG. 14, and multi-pass multiple writing with a multiplicity of 4 is performed. Since the multiplicity N=4, from the above-mentioned mathematical expression (1) the weights w1 to w4 are:

$$w1=4\times m2m3m4/(m1m2m3+m2m3m4+m3m4m1+m4m1m2)$$

$$w2=4\times m1m3m4/(m1m2m3+m2m3m4+m3m4m1+m4m1m2)$$

$$w3=4\times m1m2m4/(m1m2m3+m2m3m4+m3m4m1+m4m1m2)$$

$$w4=4\times m1m2m4/(m1m2m3+m2m3m4+m3m4m1+m4m1m2)$$

When the maximum modulation rates m1 to m4 before the weighting are the same as the example shown in FIG. 12, the maximum modulation rates M1 to M4 of the regions R1 to R4 after the weighting are M1=1.26, M2=1.26, M3=1.26, M4=1.26. In the example shown in FIG. 14, the maximum modulation rate in the beam array 34 after the weighting is 1.32, and in the example shown in FIG. 15, the maximum modulation rate is 1.26. Therefore, it is seen that the writing time can be improved by approximately 5% by increasing the multiplicity.

Figure 16:
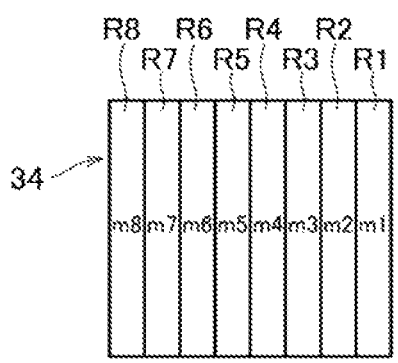
FIG. 16 is a chart showing an example of a writing method of multiple writing and weighting of modulation rates.

The beam array 34 may be divided in a horizontal direction. FIG. 16 shows an example in which the beam array 34 is divided into sub-beam arrays of eight regions R1 to R8 with the same width in a horizontal direction. When the beam array 34 is divided in a horizontal direction, in-pass multiple writing is performed. In this example, since the beam array 34 is divided into eight regions R1 to R8 in a horizontal direction, in-pass multiple writing with a multiplicity of 8 is performed.

The weight for each region can be calculated by the above-mentioned mathematical expression (1). For instance, when the maximum modulation rates m1, m8 of the regions R1, R8 are each 1.5, and the maximum modulation rates m2 to m7 of the regions R2 to R7 are each 1.2, the weights w1, w3 are each 0.8, w2 to W7 are each 1.05. The maximum modulation rates M1 to M8 of the regions R1 to R8 after the weighting are each 1.26. It is seen that by the weighting, the maximum modulation rate in the beam array 34 can be reduced from 1.5 to 1.26, and the writing time can be improved by 12%.

Figure 17:
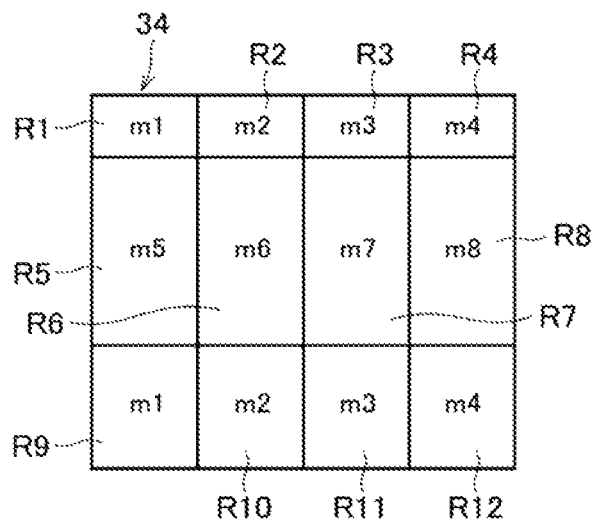
FIG. 17 is a chart showing an example of a writing method of multiple writing and weighting of modulation rates.

The beam array 34 may be divided in a vertical direction and a horizontal direction. FIG. 17 shows an example in which the beam array 34 is divided into sub-beam arrays of totally 12 regions R1 to R12, thirds in a vertical direction and fourths in a horizontal direction. When the beam array 34 is divided in a vertical direction and a horizontal direction, both multi-pass multiple writing and in-pass multiple writing are performed.

For instance, writing is performed while the stage is moved in the right direction, during writing on one stripe region, the region irradiated with the beams for the regions R1, R5, R9 is irradiated with the beams for the regions R2, R6, R10 next. Subsequently, the region is irradiated with the beams for the regions R3, R7, R11. Next, the region is irradiated with the beams for the regions R4, R8, R12. Thus, in-pass multiple writing with a multiplicity of 4 is performed.

Alternatively, multi-pass multiple writing is performed while a stripe is shifted by half the width of the stripe region. Thus, multi-pass multiple writing with a multiplicity of 2 is performed so that the region for which writing is performed with the beams for the regions R1 to R4, R9 to R12 is overlapped with the region for which writing is performed with the beams for the regions R5 to R8. The in-pass multiple writing with a multiplicity of 4 and the multi-pass multiple writing with a multiplicity of 2 produce the total multiplicity of 8 (=4×2).

Since both the region R1 and the region R9 are overlapped with the region R5, these regions are treated as the same region in the sense that the same weight is used. Thus, the higher one of the maximum modulation rate of the region R1 and the maximum modulation rate of the region R9 is set to the maximum modulation rate m1 of the regions R1 and R9. Similarly, the higher one of the maximum modulation rate of the region R2 and the maximum modulation rate of the region R10 is set to the maximum modulation rate m2 of the regions R2 and R10. The higher one of the maximum modulation rate of the region R3 and the maximum modulation rate of the region R11 is set to the maximum modulation rate m3 of the regions R3 and R11. The higher one of the maximum modulation rate of the region R4 and the maximum modulation rate of the region R12 is set to the maximum modulation rate m4 of the regions R4 and R12.

The weight for each region can be calculated by the above-mentioned mathematical expression (1). For instance, it is assumed that the maximum modulation rates m1=1.5, m2=1.2, m3=1.2, m4=1.5. In addition, it is assumed that the maximum modulation rates m5 to m8 of the regions R5 to R8 are m5=1.2, m6=1.0, m7=1.0, m8=1.5.

Then, the weights w1 to w8 for the maximum modulation rates m1 to m8 are respectively the values as shown in FIG. 17. The maximum modulation rates M1 to M8 after the weighting are each 1.23. It is seen that by the weighting, the maximum modulation rate in the beam array 34 can be reduced from 1.5 to 1.23, and the writing time can be improved by 18%.

Then, in a peripheral region of the beam array having a high modulation rate, for instance, in the region R1, the maximum modulation rate is decreased from m1=1.5 to M1=1.23, and in a central region of the beam array having a low modulation rate, for instance, in the region R6, the maximum modulation rate of is increased from m6=1.0 to M6=1.23. When high original modulation rates m1 to m8 are caused by the modulation amount due to beam position displacement, by using the present method, the contribution of the exposure amount in the multiple writing is increased in the region R6 where the beam position displacement is small, and is decreased in the region R1 where the beam position displacement is large. When correction of the beam position displacement amount is not complete, not only the writing time, but also the writing accuracy is improved.

A region with a weight of 0 may be provided. When the weight is 0, the beam in the region is not used. For instance, the beam current amount map may be referred to, and the weight for a region may be 0, the region having an always-off defect and not being set to beam-on.

Figure 18A:
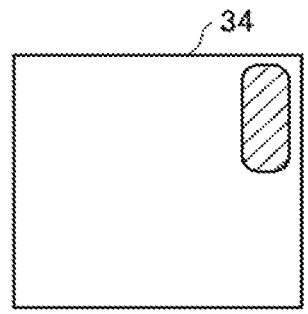
FIGS. 18A and 18B are views showing an example of divided regions.
Figure 18B:
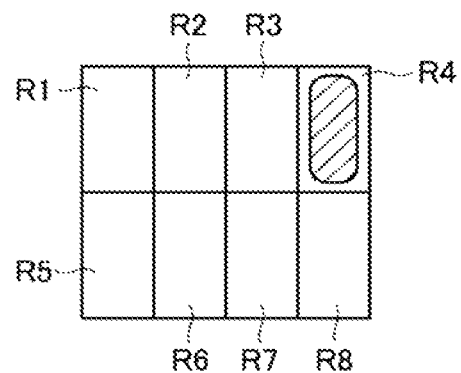

It is preferable to determine a method of dividing the beam array 34 into regions according to the position and size of a portion which has a high modulation rate in the beam array 34. For instance, in the example shown in FIGS. 18A, 18B, the beam array 34 is divided into halves in a vertical direction, fourths in a horizontal direction, thus total eight regions R1 to R8. The shaded portion in the figures is a portion having a high modulation rate.

Figure 19A:
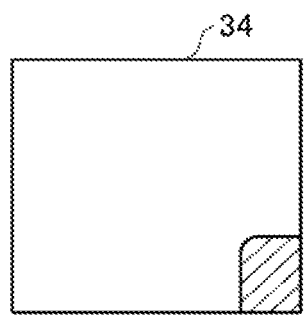
FIGS. 19A and 19B are views showing an example of divided regions.
Figure 19B:
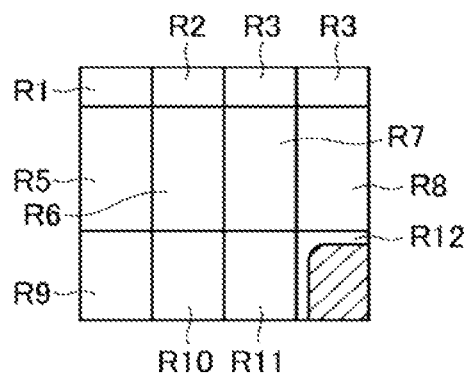

In the example shown in FIGS. 19A and 19B, the beam array 34 is divided into thirds in a vertical direction, fourths in a horizontal direction, thus total 12 regions R1 to R12. In the example shown in FIGS. 20A and 20B, the beam array 34 is divided into fourths in a vertical direction, fourths in a horizontal direction, thus total 16 regions R1 to R16.

In a weight calculation step (S134) of FIG. 10, the weight calculator 115 performs region-division corresponding to predetermined multiple writing methods for multiple writing, respectively stored in the memories, and calculates the weight.

For instance, region-division is performed in four ways shown in FIGS. 21A to 21D, and the weights in respective region-division methods are calculated.

For instance, FIG. 21A shows a method of performing in-pass multiple writing with a multiplicity of 8, by which the beam array is divided eight regions with the same width in a horizontal direction.

In FIG. 21B, the beam array is divided into thirds in a vertical direction, fourths in a horizontal direction, total 12 regions, thus FIG. 21B shows a method of performing multiple writing with a total multiplicity of 8 by in-pass multiple writing with a multiplicity of 4 and multi-pass multiple writing with a multiplicity of 2. The widths of the upper and lower division regions are adjustable. The total of the widths of the upper and lower division regions is the same as the width of the central division region.

In FIG. 21C, the beam array is divided into thirds in a vertical direction, eighths in a horizontal direction, total 24 regions, thus FIG. 21C shows a method of performing multiple writing with a total multiplicity of 16 by in-pass multiple writing with a multiplicity of 8 and multi-pass multiple writing with a multiplicity of 2.

In FIG. 21D, the beam array is divided into fourths in a vertical direction, fourths in a horizontal direction, total 16 regions, thus FIG. 21D shows a method of performing multiple writing with a total multiplicity of 16 (4×4) by in-pass multiple writing with a multiplicity of 4 and multi-pass multiple writing with a multiplicity of 4.

In a region division method determination step (S136), the determinator 116 compares the maximum modulation rates after weighting is performed by multiple region division methods, and determines a region division method which produces the lowest maximum modulation rate. For instance, region division is performed by each of the methods shown in FIGS. 21A to 21D, weights are calculated, and the maximum modulation rates after the weighting are compared. By determining a region division method, the multiplicity of multiple writing, and the weight assigned to each division region of the beam array are determined. In short, the modulation rate after the weighting of each beam is determined.

As an irradiation amount calculation step (S140), for each pixel 36, the irradiation amount calculator 117 calculates an incident irradiation amount D(x) (dose amount, exposure amount) for irradiating the pixel 36. The incident irradiation amount D(x) may be calculated, for instance, by multiplying a predetermined base irradiation amount Dbase by the pattern area density ρ(x) and the proximity effect correction coefficient Dp(x). The base irradiation amount Dbase can be defined by Dth/(½+η), for instance.

The irradiation amount calculator 117 calculates an irradiation amount of each beam (individual beam) of a multi-beam for each shot. For instance, the irradiation amount calculator 117 calculates an irradiation amount by dividing the incident irradiation amount D(x) of a pixel irradiated with the individual beam by the multiplicity of a multiple writing method determined by the determinator 116, and multiplying the quotient by the weighted modulation rate of the individual beam.

As a writing step (S140), the writer W writes a pattern on the substrate 101 using the multiple writing method determined by the determinator 116. For instance, the writing controller 118 converts the irradiation amount of each beam calculated by the irradiation amount calculator 117 into irradiation time data, and transfers the data to the deflection control circuit 130. The deflection control circuit 130 controls on-off of each blanker of the blanking plate 204 based on the irradiation time data. Consequently, the pattern can be written so that the effect of beam position displacement is eliminated.

In this manner, according to the present embodiment, the beam array is divided so that a beam having a high modulation rate and a beam having a low modulation rate belong to different regions. For instance, the modulation rate of the beam in the first region is higher than the modulation rate of the beam in the second region. The weighting is performed to decrease the modulation rate of the beam in the first region and the weighting is performed to increase the modulation rate of the beam in the second region. Then multiple writing is performed so that the pattern written with the beam of the first region is overlapped with the pattern written with the beam of the second region.

For instance, weighting is performed so that the maximum modulation rate in the first region and the maximum modulation rate in the second region are equal, or the difference thereof is less than or equal to a predetermined value. This can reduce the maximum irradiation amount of the multi-beam for the entire beam array, thus the writing time can be shortened, and reduction in the throughput can be prevented. In addition, improvement of the writing accuracy is expected because the maximum irradiation amount is reduced.

While certain embodiments have been described, these embodiments have been presented by way of example only, and are not intended to limit the scope of the inventions. For instance, the stage speed may not be constant during stripe writing, and control may be performed so that the stage speed is changed during stripe writing. In the embodiment, a charged particle multi-beam writing apparatus has been described, which controls a charged particle beam with a blanking aperture array. However, the present invention is similarly applicable to a charged particle beam writing apparatus that does not use a blanking aperture, and a multi-laser beam writing apparatus that uses a digital micromirror device (DMD). The beam current amount measurement in the embodiment is replaced by laser light intensity measurement. The novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A multi-beam writing method comprising:
forming a beam array of a multi-beam for scanning a region on a substrate and performing multiple writing;
assigning sub-beam arrays to be used for writing to each of a plurality of sub-stripe regions for each time of the writing in the multiple writing, the sub-stripe regions being obtained by dividing a region on the substrate into regions smaller than or equal to a width of the beam array, and the sub-beam arrays being obtained by dividing the beam array;

calculating an irradiation time modulation rate being used for each beam belonging to each of the sub-beam arrays;

calculating a weight for each of the sub-beam arrays based on the irradiation time modulation rate for each of the beams belonging to a group of the sub-beam arrays, and assigning the calculated weight to the sub-beam array, the group of the sub-beam arrays corresponding to a group of the sub-stripe regions overlapped each other on the substrate; and performing multiple writing on each of the sub-stripe regions by performing writing on each of the sub-stripe regions with the sub-beam arrays, based on the weight assigned to the sub-beam array and the irradiation time modulation rate of the beam belonging to the sub-beam array.

2. The method according to claim 1,
wherein the weight for each sub-beam array belonging to the group of the sub-beam arrays is lower for the sub-beam array than another beam array belonging to the group of the sub-beam arrays having a higher maximum value of the modulation rate for the beams belonging to the sub-beam array.

3. The method according to claim 1,
wherein a modulation rate of an irradiation time of a beam is calculated using at least one of a modulation rate calculated from an intensity of each beam of the multi-beam and a modulation rate calculated from a position displacement amount of each beam of the multi-beam.

4. The method according to claim 1,
wherein the beam array of the multi-beam is divided in a direction parallel to or a direction perpendicular to a scanning direction to generate the plurality of sub-beam arrays.

5. The method according to claim 1,
wherein an average of the weight for the sub-beam arrays is 1.

6. The method according to claim 1,
wherein the weight for the sub-beam array including a beam with an always-off defect is set to 0.

7. A multi-beam writing apparatus comprising:
a multi-beam generator forming a beam array of a multi-beam for scanning a region on a substrate and performing multiple writing;

a modulation rate calculator assigning sub-beam arrays to be used for the writing to each of a plurality of sub-stripe regions for each time of the writing in the multiple writing, the sub-stripe regions being obtained by dividing a region on the substrate into regions smaller than or equal to a width of the beam array, the sub-beam arrays being obtained by dividing the beam array, and calculating an irradiation time modulation rate for each beam belonging to each of the sub-beam arrays;

a weight calculator calculating a weight for each of the sub-beam arrays based on the irradiation time modulation rate for each beam in the sub-beam array belonging to a group of the sub-beam arrays corresponding to a group of the sub-stripe regions overlapped each other on the substrate, and assigning the calculated weight to the sub-beam array; and a writer performing multiple writing on each of the sub-stripe regions by performing writing on each of the sub-stripe regions with the sub-beam arrays, based on the weight assigned to the sub-beam array and the irradiation time modulation rate of the beam belonging to the sub-beam array.

8. The apparatus according to claim 7,
wherein the weight for each sub-beam array belonging to the group of the sub-beam arrays is lower for the sub-beam array than another beam array belonging to the group of the sub-beam arrays having a higher maximum value of the modulation rate for the beams belonging to the sub-beam array.

9. The apparatus according to claim 7,
wherein a modulation rate of an irradiation time of a beam is calculated using at least one of a modulation rate calculated from an intensity of each beam of the multi-beam and a modulation rate calculated from a position displacement amount of each beam of the multi-beam.

10. The apparatus according to claim 7,
wherein the beam array of the multi-beam is divided in a direction parallel to or a direction perpendicular to a scanning direction to generate the plurality of the sub-beam arrays.

11. The apparatus according to claim 7,
wherein an average of the weight for the sub-beam arrays is 1.

12. The apparatus according to claim 7,
wherein the weight for the sub-beam array including a beam with an always-off defect is set to 0.

* * * * *